(12) United States Patent
Huang

(10) Patent No.: US 9,830,877 B2
(45) Date of Patent: Nov. 28, 2017

(54) SHIFT REGISTER, GATE DRIVING CIRCUIT, DISPLAY PANEL AND DISPLAY APPARATUS

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventor: Fei Huang, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 0 days.

(21) Appl. No.: 14/909,842

(22) PCT Filed: Aug. 21, 2015

(86) PCT No.: PCT/CN2015/087764
§ 371 (c)(1),
(2) Date: Feb. 3, 2016

(87) PCT Pub. No.: WO2016/150089
PCT Pub. Date: Sep. 29, 2016

(65) Prior Publication Data
US 2017/0039973 A1    Feb. 9, 2017

(30) Foreign Application Priority Data
Mar. 26, 2015 (CN) .......................... 2015 1 0138219

(51) Int. Cl.
*G11C 19/00* (2006.01)
*G09G 3/36* (2006.01)
*G11C 19/28* (2006.01)

(52) U.S. Cl.
CPC ............. *G09G 3/3677* (2013.01); *G09G 3/36* (2013.01); *G11C 19/28* (2013.01);
(Continued)

(58) Field of Classification Search
None
See application file for complete search history.

(56) References Cited

U.S. PATENT DOCUMENTS 5,654,659 A      8/1997   Asada
5,990,857 A  *  11/1999   Kubota ................ G09G 3/3648
                                                                    345/100
(Continued)

FOREIGN PATENT DOCUMENTS

CN       102654968 A      9/2012
CN       102708818 A     10/2012
(Continued)

OTHER PUBLICATIONS

First Chinese Office Action dated Aug. 26, 2016; Appln. No. 201510138219.2.
(Continued)

*Primary Examiner* — Tuan T Lam
(74) *Attorney, Agent, or Firm* — Ladas & Parry LLP

(57) ABSTRACT

There are provided a shift register, a gate driving circuit, a display panel and a display apparatus. The shift register comprises: an input module (01) configured to output a signal of a signal input terminal to a first node (P1); a reset module (02) configured to output a signal of a reset signal terminal to the first node (P1); an output module (03) configured to output a signal of the first node (P1) to a scanning signal output terminal (Out); a buffer module (04) configured to output the signal of the first node (P1) to a triggering signal terminal (STV); and an auxiliary module (05) configured to output a high level signal input by the (Continued)

clock signal terminal (CLK) to the second node (P2) which controls the output module (03) to output the scanning signal to the scanning signal output terminal. The shift register inputs selectively the clock signal when the shift register outputs a scanning signal by adding the auxiliary module, such that the power consumption of the shift register can be reduced, and thus the yield rate of display panels is raised.

15 Claims, 5 Drawing Sheets

(52) U.S. Cl.
CPC .............. *G09G 2310/0286* (2013.01); *G09G 2310/0291* (2013.01); *G09G 2310/08* (2013.01); *G09G 2330/021* (2013.01)

(56) References Cited

U.S. PATENT DOCUMENTS

| | | | |
|---|---|---|---|
| 6,211,711 B1* | 4/2001 | Laurier | G01R 31/31701 327/199 |
| 6,333,959 B1 | 12/2001 | Lai et al. | |
| 6,879,313 B1* | 4/2005 | Kubota | G09G 3/3688 345/100 |
| 2001/0011987 A1* | 8/2001 | Kubota | G09G 3/3677 345/98 |
| 2003/0174115 A1* | 9/2003 | Washio | G09G 3/3688 345/98 |
| 2004/0108989 A1* | 6/2004 | Gyouten | G09G 3/3677 345/100 |
| 2005/0259778 A1* | 11/2005 | Kimura | G09G 3/20 377/78 |
| 2008/0152072 A1 | 6/2008 | Herrmann et al. | |
| 2009/0121998 A1* | 5/2009 | Ohkawa | G09G 3/3688 345/100 |
| 2010/0201659 A1 | 8/2010 | Miyake et al. | |
| 2016/0189797 A1* | 6/2016 | Yamamoto | G11C 19/28 377/64 |

FOREIGN PATENT DOCUMENTS

| | | |
|---|---|---|
| CN | 103985341 A | 8/2014 |
| CN | 104269145 A | 1/2015 |
| CN | 104282282 A | 1/2015 |
| CN | 104361853 A | 2/2015 |
| CN | 104361875 A | 2/2015 |
| CN | 104700806 A | 6/2015 |

OTHER PUBLICATIONS

International Search Report & Written Opinion of the International Searching Authority Appln. No. PCT/CN2015/087764; dated Dec. 18, 2015.

* cited by examiner

SHIFT REGISTER, GATE DRIVING CIRCUIT, DISPLAY PANEL AND DISPLAY APPARATUS

TECHNICAL FIELD

The present disclosure relates to a shift register, a gate driving circuit, a display panel and a display apparatus.

BACKGROUND

At present, with the development of liquid crystal display technique, the liquid crystal panel industry is increasingly competitive, and reducing production cost of a liquid crystal display panel becomes a preferred alternative for panel manufacturers to enhance competitiveness. Generally, in order to reduce the production cost of the display panel, an edge of the display panel is utilized by those skilled in the related art to construct a gate driving circuit. The gate driving circuit comprises a plurality of shift registers, each of which is corresponding to a gate line. The plurality of shift registers is arranged in series, and there is a triggering signal delivered stage by stage between two adjacent shift registers. After each shift register receives the triggering signal, a gate scanning signal is output to the corresponding gate line, and the triggering signal is transmitted to a next stage of unit circuit to realize the function of gate driving. Such a design would avoid separately setting a gate driver chip in a frame area of the display panel, which is advantageous to realize the narrow-frame design of the display panel. At the same time, the production cost of related products is reduced, and market competitiveness of display products is raised.

However, when the existing shift register circuit operates normally, clock signals are input constantly to the shift register circuit directly, such that the shift register circuit has large power consumption, and yield rate of the display panel is reduced.

SUMMARY

There are provided in the embodiments of the present disclosure a shift register, a gate driving circuit, a display panel and a display apparatus.

An embodiment of the present disclosure provides a shift register, comprising:

an input module, whose input terminal is connected to a signal input terminal, first control terminal is connected to a first reference signal terminal, second control terminal is connected to a second reference signal terminal, and output terminal is connected to a first node, configured to output a signal of the signal input terminal to the first node under the control of the first reference signal terminal and the second reference signal terminal;

a reset module, whose input terminal is connected to a reset signal terminal, first control terminal is connected to the second reference signal terminal, second control terminal is connected to the first reference signal terminal, and output terminal is connected to the first node, configured to output a signal of the reset signal terminal to the first node under the control of the first reference signal terminal and the second reference signal terminal;

an output module, whose input terminal is connected to the first node, control terminal is connected to a second node, and output terminal is connected to a scanning signal output terminal, configured to output a signal of the first node to the scanning signal output terminal under the control of the second node;

a buffer module, whose input terminal is connected to the first node, control terminal is connected to a clock signal terminal, and output terminal is connected to a triggering signal terminal, configured to output the signal of the first node to the triggering signal terminal under the control of the clock signal terminal, wherein the triggering signal terminal is used to input a triggering signal to a signal input terminal of an adjacent next stage of shift register; and an auxiliary module, whose first input terminal is connected to the clock signal terminal, second input terminal is connected to a low level signal terminal, first control terminal is connected to the signal input terminal, second control terminal is connected to the reset signal terminal, and output terminal is connected to the second node, configured to output a high level signal input by the clock signal terminal to the second node under the control of the signal input terminal and the reset signal terminal, wherein the second node controls the output module to output a scanning signal to the scanning signal output terminal.

In a possible implementation, in the shift register provided in the embodiment of the present disclosure, the auxiliary module can comprise: a first transmission gate, a first NOT gate, a switch transistor, and a NOR gate; wherein a first input terminal of the NOR gate is connected to the signal input terminal, a second input terminal thereof is connected to the reset signal terminal, and an output terminal is connected to an input terminal of the first NOT gate, a gate of the switch transistor and a first control terminal of the first transmission gate respectively;

a second control terminal of the first transmission gate is connected to an output terminal of the first NOT gate, an input terminal thereof is connected to the clock signal terminal, and an output terminal is connected to a source of the switch transistor and the second node respectively; and a drain of the switch transistor is connected to the low level signal terminal.

In a possible implementation, in the shift register provided in the embodiment of the present disclosure, the output module can comprise: a second NOT gate, a third NOT gate, a first tri-state gate and a second tri-state gate; wherein an input terminal of the second NOT gate is connected to the second node, an output terminal thereof is connected to a first control terminal of the first tri-state gate and a second control terminal of the second tri-state gate respectively;

an input terminal of the first tri-state gate is connected to the first node, a second control terminal thereof is connected to the second node and a first control terminal of the second tri-state gate respectively, and an output terminal thereof is connected to an output terminal of the second tri-state gate and an input terminal of the third NOT gate respectively; and an output terminal of the third NOT gate is connected to an input terminal of the second tri-state gate and the scanning signal output terminal respectively.

In a possible implementation, in the shift register provided in the embodiment of the present disclosure, the input module can comprise: a second transmission gate;

a first control terminal of the second transmission gate is connected to the first reference signal terminal, a second control terminal thereof is connected to the second reference signal terminal, an input terminal thereof is connected to the signal input terminal, and an output terminal thereof is connected to the first node.

In a possible implementation, in the shift register provided in the embodiment of the present disclosure, the reset module can comprise: a third transmission gate; wherein a first control terminal of the third transmission gate is connected to the second reference signal terminal, a second control terminal thereof is connected to the first reference signal terminal, an input terminal thereof is connected to the reset signal terminal, and an output terminal thereof is connected to the first node.

In a possible implementation, in the shift register provided in the embodiment of the present disclosure, the buffer module can comprise: a NAND gate, a fourth NOT gate, a fifth NOT gate and a sixth NOT gate; wherein a first input terminal of the NAND gate is connected to the clock signal terminal, a second input terminal thereof is connected to the first node, and an output terminal thereof is connected to an input terminal of the fourth NOT gate;

an output terminal of the fourth NOT gate is connected to an input terminal of the fifth NOT gate;

an output terminal of the fifth NOT gate is connected to an input terminal of the sixth NOT gate; and an output terminal of the sixth NOT gate is connected to the triggering signal terminal.

There is provided in an embodiment of the present disclosure a gate driving circuit, comprising a plurality of shift registers provided in the embodiment of the present disclosure connected in cascades. Except for a first stage of shift register and a last stage of shift register, a triggering signal terminal of each of remaining stages of shift registers is connected to a signal input terminal of an adjacent next stage of shift register, and a scanning signal output terminal thereof is connected to a reset signal terminal of an adjacent previous stage of shift register; a triggering signal terminal of the first stage of shift register is connected to a signal input terminal of a second stage of shift register; and a scanning signal output terminal of the last stage of shift register is connected to a reset signal terminal of itself and the reset signal terminal of the adjacent previous stage of shift register respectively.

There is provided in an embodiment of the present disclosure a display panel, comprising the gate driving circuit provided in an embodiment of the present disclosure.

There is provided in an embodiment of the present disclosure a display apparatus, comprising the display panel provided in an embodiment of the present disclosure.

There are provided in the embodiments of the present disclosure a shift register, a gate driving circuit, a display panel and a display apparatus. The shift register comprises: an input module, a reset module, an output module and a buffer module. The input module is configured to output the signal of the signal input terminal to the first node under the control of the first reference signal terminal and the second reference signal terminal; the reset module is configured to output the signal of the reset signal terminal to the first node under the control of the first reference signal terminal and the second reference signal terminal; the output module is configured to output the signal of the first node to the scanning signal output terminal under the control of the second node; and the buffer module is configured to output the signal of the first node to the triggering signal terminal under the control of the clock signal terminal. The shift register of the present disclosure further comprises the auxiliary module configured to output the high level signal input by the clock signal terminal to the second node under the control of the signal input terminal and the reset signal terminal, wherein the second node controls the output module to output the scanning signal to the scanning signal output terminal. In this way, the process that the shift register outputs the scanning signal to the corresponding gate line within the corresponding period of time, to drive the display panel to realize progressive scanning, can be realized. Compared with the prior art where the clock signals are input constantly to the shift register when the shift register operates normally, the shift register of the present disclosure inputs selectively the clock signal input by the clock signal terminal to the shift register by adding the auxiliary module, that is, when the shift register outputs the scanning signal, the cock signal is input selectively, and the clock signal input by the clock signal terminal within other periods of time is maintained in a low potential state, such that the power consumption of the shift register can be reduced, and thus the yield rate of display panels is raised.

DETAILED DESCRIPTION

Specific implementations of a shift register, a gate driving circuit, a display panel, and a display apparatus provided in embodiments of the present disclosure will be described in detail by combining with figures.

Figure 1:
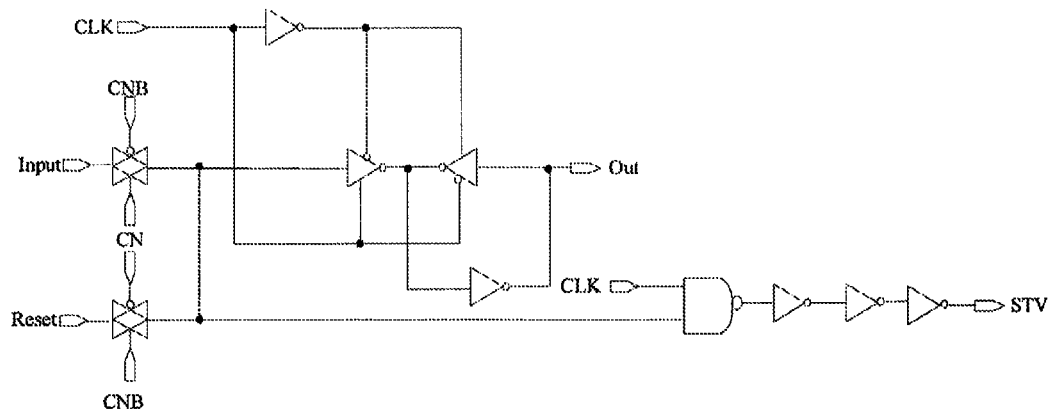
FIG. 1 is a schematic diagram of a structure of a known shift register.

FIG. 1 shows a circuit structure of a known shift register. In the shift register circuit as shown in FIG. 1, shifting of an input signal is realized mainly by a clock signal CLK. Therefore, controlling the clock signal well would be capable of controlling shifting of the input signal better, so that performance of the entire shift register circuit is raised.

Figure 2:
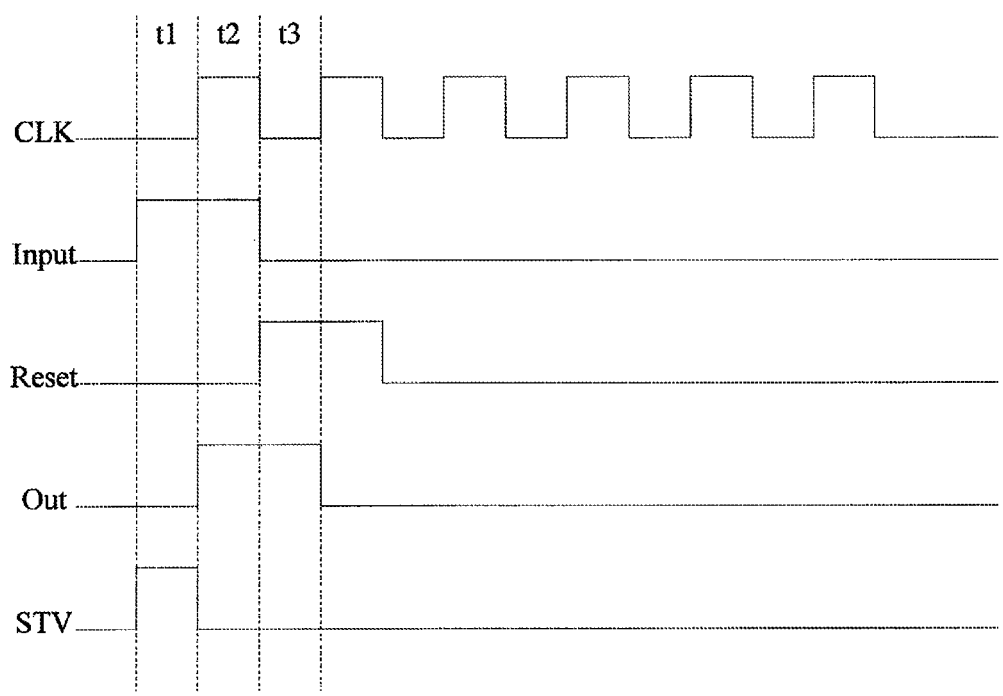
FIG. 2 is a timing diagram of input and output of a known shift register.

FIG. 2 shows a timing diagram of corresponding input and output of the shift register circuit as shown in FIG. 1.

Figure 3:
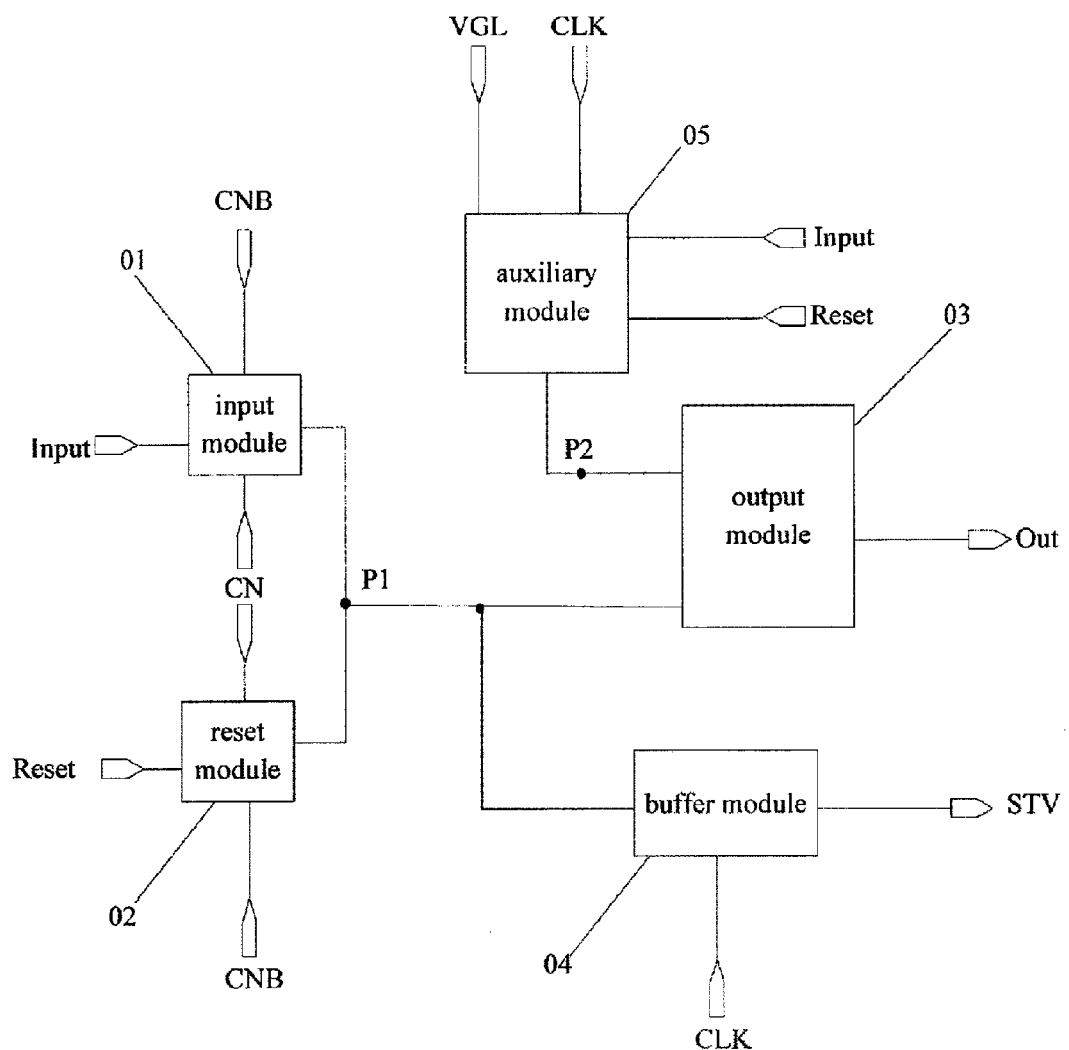
FIG. 3 is a schematic diagram of a structure of a shift register provided in an embodiment of the present disclosure.

FIG. 3 shows a schematic diagram of a structure of the shift register provided in the embodiment of the present disclosure. As shown in FIG. 3, the shift register provided in the embodiment of the present disclosure comprises: an input module 01, a reset module 02, an output module 03, a buffer module 04 and an auxiliary module 05.

An input terminal of the input module 01 is connected to a signal input terminal Input, a first control terminal thereof is connected to a first reference signal terminal CN, a second control terminal thereof is connected to a second reference signal terminal CNB, and an output terminal thereof is connected to a first node P1. The input module 01 is configured to output a signal of the signal input terminal Input to the first node P1 under the control of the first reference signal terminal CN and the second reference signal terminal CNB.

An input terminal of the reset module 02 is connected to a reset signal terminal Reset, a first control terminal thereof is connected to the second reference signal terminal CNB, a second control terminal thereof is connected to the first reference signal terminal CN, and an output terminal thereof is connected to the first node P1. The reset module 02 is configured to output a signal of the reset signal terminal Reset to the first node P1 under the control of the first reference signal terminal CN and the second reference signal terminal CNB.

An input terminal of the output module 03 is connected to the first node P1, a control terminal thereof is connected to a second node P2, and an output terminal thereof is connected to a scanning signal output terminal Out. The output module 03 is configured to output a signal of the first node P1 to the scanning signal output terminal Out under the control of the second node P2.

An input terminal of the buffer module 04 is connected to the first node P1, a control terminal thereof is connected to the clock signal terminal CLK, and an output terminal thereof is connected to a triggering signal terminal STV. The buffer module 04 is configured to output the signal of the first node P1 to the triggering signal terminal STV under the control of the clock signal terminal CLK, wherein the triggering signal terminal STV is used to input a triggering signal to the signal input terminal Input of an adjacent next stage of shift register.

A first input terminal of the auxiliary module 05 is connected to the clock signal terminal CLK, a second input terminal thereof is connected to a low level signal terminal VGL, a first control terminal thereof is connected to the signal input terminal Input, a second control terminal thereof is connected to the reset signal terminal Reset, and an output terminal thereof is connected to the second node P2. The auxiliary module 05 is configured to output a high level signal input by the clock signal terminal CLK to the second node P2 under the control of the signal input terminal Input and the reset signal terminal Reset, where the second node P2 controls the output module 03 to output the scanning signal to the scanning signal output terminal Out.

The above shift register comprises: the input module 01, the reset module 02, the output module 03 and the buffer module 04. The input module 01 is configured to output the signal of the signal input terminal Input to the first node P1; the reset module 02 is configured to output the signal of the reset signal terminal Reset to the first node P1; the output module 03 is configured to output the signal of the first node P1 to the scanning signal output terminal Out; and the buffer module 04 is configured to output the signal of the first node P1 to the triggering signal terminal STV. The shift register further comprises the auxiliary module 05 configured to output the high level signal input by the clock signal terminal CLK to the second node P2 which controls the output module 03 to output the scanning signal to the scanning signal output terminal Out. In this way, the procedure that the shift register outputs the scanning signal to the corresponding gate line within the corresponding period of time, to drive the display panel to realize progressive scanning, can be realized. Compared with the prior art where the clock signals are input constantly to the shift register when the shift register operates normally, the shift register provided in the embodiment of the present disclosure inputs selectively the clock signal input by the clock signal terminal to the shift register by adding the auxiliary module, that is, when the shift register outputs the scanning signal, the cock signal is input selectively, and the clock signal input by the clock signal terminal within other periods of time is maintained in a low potential state, such that the power consumption of the shift register can be reduced.

Figure 4:
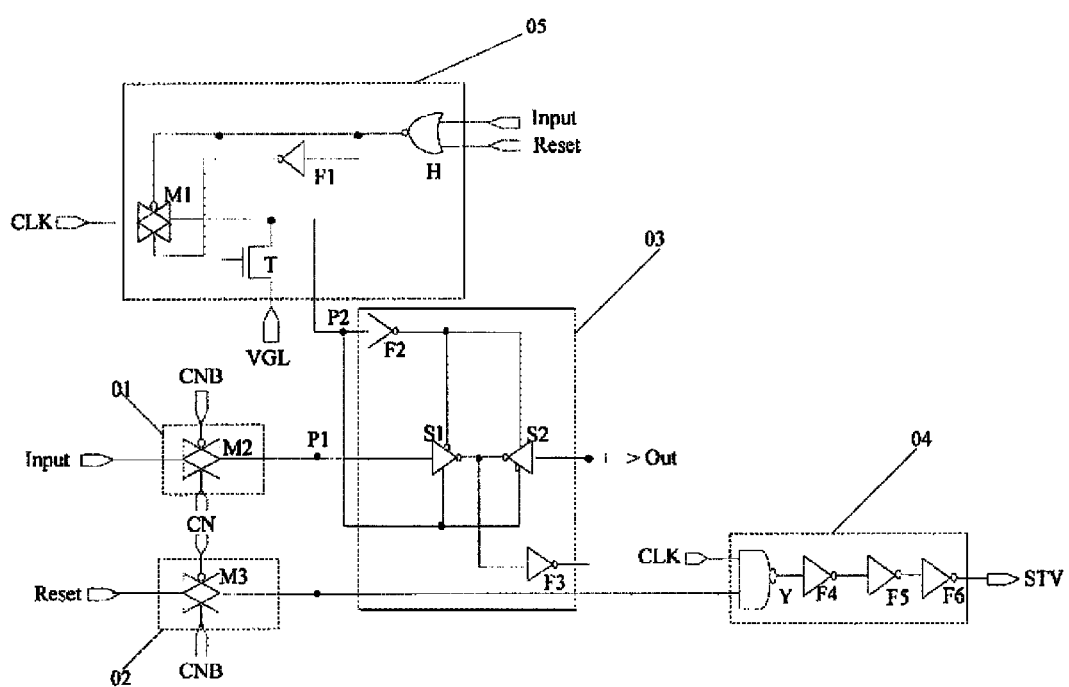
FIG. 4 is a schematic diagram of a specific structure of a shift register provided in an embodiment of the present disclosure.

FIG. 4 is a schematic diagram of a specific structure of a shift register provided in an embodiment of the present disclosure. When performing the concrete implementation, in the shift register provided in the embodiment of the present disclosure, as shown in FIG. 4, the auxiliary module 05 can comprise exemplarily: a first transmission gate M1, a first NOT gate F1, a switch transistor T, and a NOR gate H. In the auxiliary module 05, a first input terminal of the NOT gate H is connected to the signal input terminal Input, a second input terminal thereof is connected to the reset signal terminal Reset, and an output terminal thereof is connected to an input terminal of the first NOT gate F1, a gate of the switch transistor T and a first control terminal of the first transmission gate M1 respectively; a second control terminal of the first transmission gate M1 is connected to an output terminal of the first NOT gate F1, an input terminal thereof is connected to the clock signal terminal CLK, and an output terminal thereof is connected to a source of the switch transistor T and the second node P2; a drain of the switch transistor T is connected to the low level signal terminal VGL.

Exemplarily, in the shift register provided in the embodiment of the present disclosure, when the NOR gate H outputs a low level signal under the control of the signal input terminal Input and the reset signal terminal Reset, the first transmission gate M1 is in a turn-on state to output the signal of the clock signal terminal CLK to the second node P2, so that the output module 03 outputs a scanning signal to the scanning signal output terminal Out under the control of the second node P2; when the NOR gate H outputs a high level signal under the control of the signal input terminal Input and the reset signal terminal Reset, the first transmission gate M1 is in a turn-off state. Now, the switch transistor T is in the turn-on state, the switch transistor T which is turned on connects the low level signal terminal VGL with the second node P2, such that a potential of the second node P2 is pulled down.

When performing the concrete implementation, in the shift register provided in the embodiment of the present disclosure, as shown in FIG. 4, the output module 03 can comprise: a second NOT gate F2, a third NOT gate F3, a first tri-state gate S1 and a second tri-state gate S2. Herein, an input terminal of the second NOT gate F2 is connected to the second node P2, an output terminal thereof is connected to a first control terminal of the first tri-state gate S1 and a second control terminal of the second tri-state gate S2 respectively. An input terminal of the first tri-state gate S1 is connected to the first node P1, a second control terminal thereof is connected to the second node P2 and a first control terminal of the second tri-state gate S2 respectively, and an output terminal thereof is connected to an output terminal of the second tri-state gate S2 and an input terminal of the third NOT gate F3 respectively; an output terminal of the third NOT gate F3 is connected to an input terminal of the second tri-state gate S2 and the scanning signal output terminal Out respectively.

Exemplarily, in the shift register provided in the embodiment of the present disclosure, when the potential of the second node P2 is pulled up, the first tri-state gate S1 is in a turn-on state, and the second tri-state gate S2 is in a turn-off state, the first tri-state gate S1 which is turned on outputs the signal of the first node P1 to the input terminal of the third NOT gate F3, and through an effect of the third NOT gate F3, the scanning signal output terminal Out outputs a signal the same as the first node P1. When the potential of the second node P2 is pulled down, the first tri-state gate S1 is in the turn-off state, the second tri-state gate S2 is in the turn-on state, the second tri-state gate S2 which is turned on outputs the signal of the scanning signal output terminal Out to the input terminal of the third NOT gate F3, and through an effect of the third NOT gate F3, the signal output by the scanning signal output terminal is further maintained.

Alternatively, in the shift register provided in the embodiment of the present disclosure, as shown in FIG. 4, the input module 01 can comprise: a second transmission gate M2, whose a first control terminal is connected to the first reference signal terminal CN, second control terminal thereof is connected to the second reference signal terminal CNB, input terminal thereof is connected to the signal input terminal Input, and output terminal thereof is connected to the first node P1.

Exemplarily, the shift register provided in the embodiment of the present disclosure can realize bilateral scanning. Generally, upon forward scanning, the first reference signal terminal CN provides the high level signal, and the second reference signal terminal CNB provides the low level signal. Upon backward scanning, the first reference signal terminal CN provides the low level signal, and the second reference signal terminal CNB provides the high level signal. Upon forward scanning, the second transmission gate M2 is turned on under the control of the first reference signal terminal CN and the second reference signal terminal CNB, and the second transmission gate M2 which is turned on outputs the signal of the signal input terminal Input to the first node P1.

Alternatively, in the shift register provided in the embodiment of the present disclosure, as shown in FIG. 4, the reset module 02 can comprise: a third transmission gate M3, whose first control terminal is connected to the second reference signal terminal CNB, second control terminal thereof is connected to the first reference signal terminal CN, input terminal thereof is connected to the reset signal Reset, and output terminal thereof is connected to the first node P1.

Exemplarily, when the shift register provided in the embodiment of the present disclosure scans backwardly, the first reference signal terminal CN provides the low level signal, the second reference signal terminal CNB provides the high level signal, the third transmission gate M3 is turned on under the control of the first reference signal terminal CN and the second reference signal terminal CNB, and the third transmission gate M3 which is turned on outputs the signal of the reset signal terminal Reset to the first node P1.

Alternatively, in the shift register provided in the embodiment of the present disclosure, as shown in FIG. 4, the buffer module 04 can comprise: a NAND gate Y, a fourth NOT gate F4, a fifth NOT gate F5 and a sixth NOT gate F6, wherein a first input terminal of the NAND gate Y is connected to the clock signal terminal CLK, a second input terminal thereof is connected to the first node P1, and an output terminal thereof is connected to an input terminal of the fourth NOT gate F4; an output terminal of the fourth NOT gate F4 is connected to an input terminal of the fifth NOT gate F5; an output terminal of the fifth NOT gat F5 is connected to an input terminal of the sixth NOT gate F6; and an output terminal of the sixth NOT gate F6 is connected to the triggering signal terminal STV.

Exemplarily, in the shift register provided in the embodiment of the present disclosure, when the potential of the first node P1 is pulled up and the clock signal terminal CLK is input the high level signal, the NAND gate Y outputs the low level signal to the input terminal of the fourth NOT gate F4, and then through the effects of the fourth NOT gate F4, the fifth NOT gate F5 and the sixth NOT gate F6, the triggering signal terminal STV is enabled to output the high level signal.

It should be noted that the circuit structure and function of the transmission gate, the tri-state gate, the NOR gate, the NAND gate and the NOT gate are the same as those in the prior art, and thus no further description is given herein. The switch transistor may be a thin film transistor (TFT) or may be a metal oxide semiconductor (MOS), and thus no further description is given herein. In the specific implementation, sources and drains of transistors can be exchanged with each other, and no specific distinction is made. The TFT are taken as an example when the specific embodiments are described.

Further, since the signal input terminal Input and the reset signal terminal Reset in the shift register provided in the embodiment of the present disclosure are designed symmetrically, their functions can be exchanged with each other. Therefore, the shift register provided in the embodiments of the present disclosure can realize the bilateral scanning.

Generally, when forward scanning is initiated, the first reference signal terminal CN provides the high level signal, and the second reference signal terminal CNB provides the low level signal. Upon backward scanning, the first reference signal terminal CN provides the low level signal, and the second reference signal terminal CNB provides the high level signal.

Figure 5:
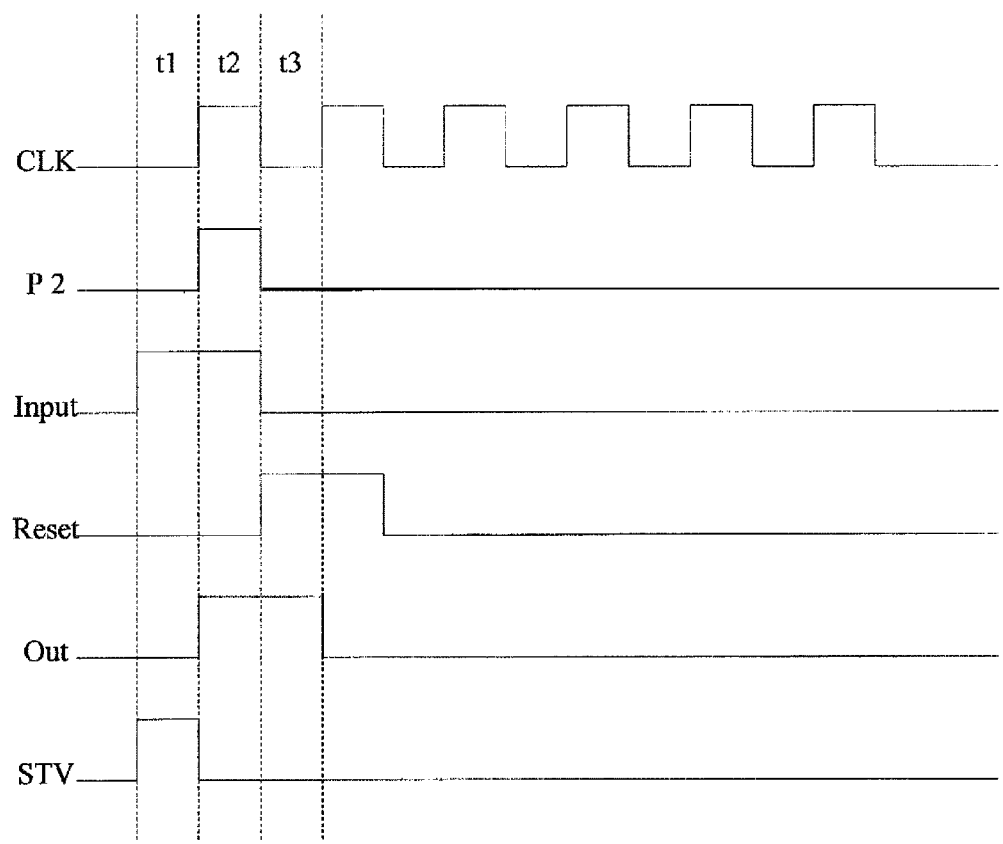
FIG. 5 is a timing diagram of input and output of a shift register provided in an embodiment of the present disclosure.

FIG. 5 is a timing diagram of input and output of a shift register provided in an embodiment of the present disclosure. The operation process of the shift register provided in the embodiment of the present disclosure will be described below by taking forward scanning as an example in combination with the shift register as shown in FIG. 4 and the timing diagram of input and output of FIG. 4 as shown in FIG. 5. Exemplarily, three phases t1-t3 in the timing sequence of input and output as shown in FIG. 5 are selected. In the following description, 1 represents a high level signal, and 0 represents a low level signal.

In a phase t1, Input=1, CLK=0, Reset=0, CN=1, CNB=0. Since CN=1 and CNB=0, the second transmission gate M2 is in the turn-on state, so that the signal of the signal input terminal Input is output to the first node P1. At the same time, since Input=1 and Reset=0, the NOR gate H outputs the low level signal to the first control terminal of the first transmission gate M1, the input terminal of the first NOT gate F1 and the gate of the switch transistor T, so that the first transmission gate M1 is in the turn-on state, the switch transistor T is in the turn-off state, and the first transmission gate M1 which is turned on outputs the signal of the clock signal terminal CLK to the second node P2. Since CLK=0 at this time, the potential of the second node P2 is pulled down. Since the potential of the second node P2 is pulled down, the first tri-state gate S1 is in the turn-off state, and the second tri-state gate S2 is in the turn-on state. Now, since the first tri-state gate S1 is in the turn-off state, the signal input by the signal input terminal Input cannot be input to the shift register, that is, the signal of the first node P1 cannot be output to the scanning signal output terminal Out via the output module 03, but output to the triggering signal terminal STV via the buffer module 04, so as to be delivered to the next stage of shift register. The phase t1 is a scanning signal delivering phase.

In a phase t2, Input=1, CLK=1, Reset=0, CN=1, CNB=0. Since CN=1 and CNB=0, the second transmission gate M2 is in the turn-on state, so that the signal of the signal input terminal Input is output to the first node P1. At the same time, since Input=1 and Reset=0, the NOR gate 11 outputs the low level signal to the first control terminal of the first transmission gate M1, the input terminal of the first NOT gate F1 and the gate of the switch transistor T. Therefore, the first transmission gate M1 is in the turn-on state, the switch transistor T is in the turn-off state, and the first transmission gate M1 which is turned on outputs the signal of the clock signal terminal CLK to the second node P2. Since CLK=1 at this time, the potential of the second node P2 is pulled up. Since the potential of the second node P2 is pulled up, the first tri-state gate S1 is in the turn-on state, and the second tri-state gate S2 is in the turn-off state. Now, since the first tri-state gate S1 is in the turn-on state, the signal input by the signal input terminal Input, i.e., the signal of the first node P1, passes through the first tri-state gate S1 and the third NOT gate F3 to be output to the scanning signal output terminal Out. At this time, the scanning signal output terminal Out outputs the high level signal. The phase t2 is a scanning signal outputting phase.

In a phase t3, Input=0, CLK=0, Reset=0, CN=1, CNB=0. Since CN=1 and CNB=0, the second transmission gate M2 is in the turn-on state, so that the signal of the signal input terminal Input is output to the first node P1. At the same time, since Input=0 and Reset=0, the NOR gate H outputs the high level signal to the first control terminal of the first transmission gate M1, the input terminal of the first NOT gate F1 and the gate of the switch transistor T. Therefore, the first transmission gate M1 is in the turn-off state, the switch transistor T is in the turn-on state, and the switch transistor T which is turned on connects the low level signal terminal VGL with the second node P2, and thus the potential of the second node P2 is pulled down. Since the potential of the second node P2 is pulled down, the first tri-state gate S1 is in the turn-off state, and the second tri-state gate S2 is in the turn-on state. Now, since the second tri-state gate S2 is in the turn-on state, the signal of the scanning signal output terminal Out passes through the second tri-state gate S2 and the third NOT gate F3 to be further maintained, and thus the scanning signal output terminal Out continues outputting the high level signal. The phase t3 is a scanning signal output maintaining phase.

Within the subsequent periods of time, the shift register would repeat the above operation processes.

Based on the same inventive concept, there is provided in an embodiment of the present disclosure a gate driving circuit, comprising a plurality of shift registers provided in the embodiment of the present disclosure connected in cascades. Except for the first stage of shift register and the last stage of shift register, a triggering signal terminal of each of remaining stages of shift registers is connected to a signal input terminal of an adjacent next stage of shift register, and a scanning signal output terminal thereof is connected to a reset signal terminal of an adjacent previous stage of shift register; a triggering signal terminal of the first stage of shift register is connected to a signal input terminal of a second stage of shift register; and a scanning signal output terminal of the last stage of shift register is connected to a reset signal terminal of itself and the reset signal terminal of the adjacent previous stage of shift register respectively.

Figure 6:
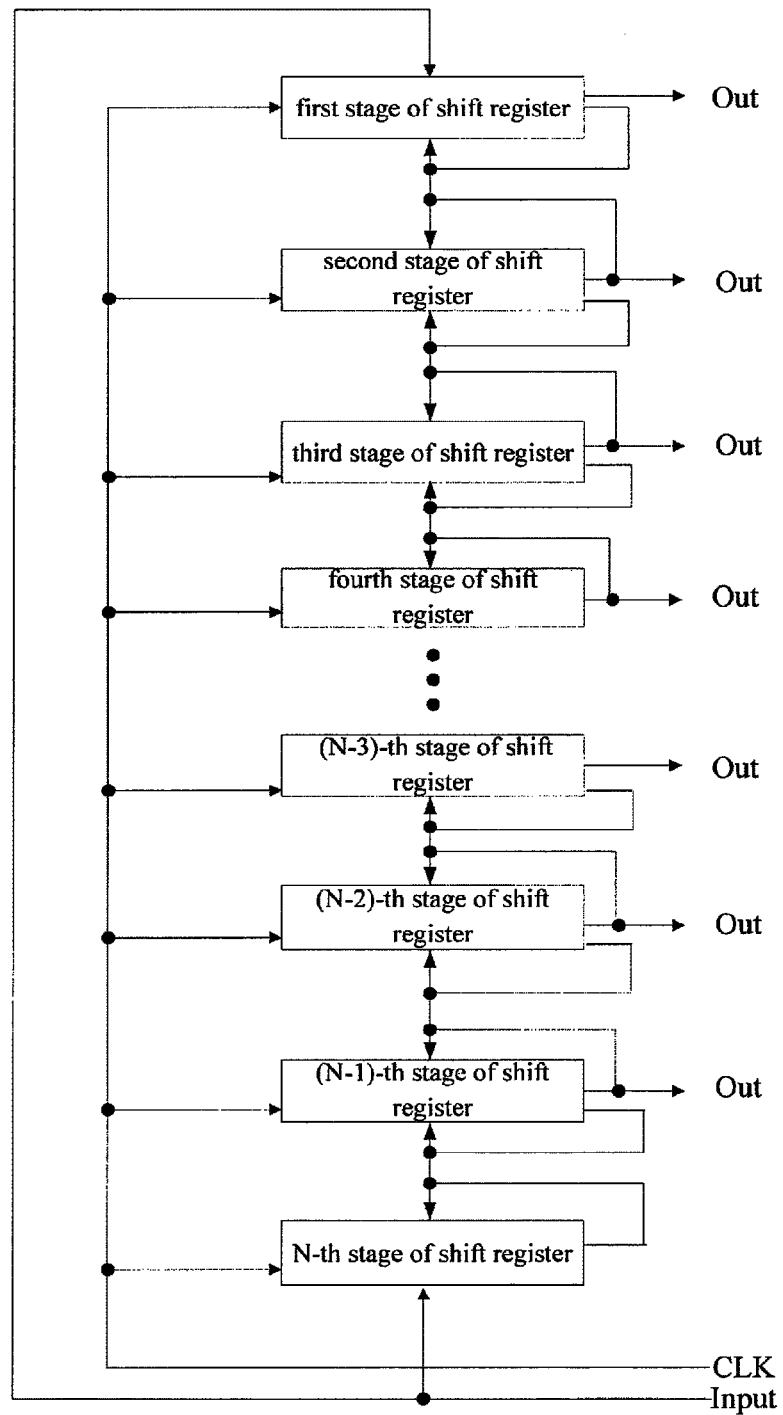
FIG. 6 is a schematic diagram of a structure of a gate driving circuit provided in an embodiment of the present disclosure.

FIG. 6 shows a schematic diagram of a structure of a gate driving circuit provided in an embodiment of the present disclosure. For the convenience of description, FIG. 6 shows only eight shift registers, i.e., a first stage of shift register, a second stage of shift register, a third stage of shift register, a fourth stage of shift register, a (N−3)-th stage of shift register, a (N−2)-th stage of shift register, a (N−1)-th stage of shift register, and a N-th stage of shift register. Herein, the scanning signal output terminal Out of the (N−1)-th stage of shift register not only outputs a gate initiating signal to a gate line connected thereto, but also outputs a reset signal to the (N−2)-th shift register, the triggering signal terminal STV thereof outputs a triggering signal to the N-th stage of shift register.

Each of the plurality of shift registers in the above gate driving circuit has the same function and structure as the above shift register provided in the present disclosure, and thus no further description is given herein.

Based on a same inventive concept, there is provided in an embodiment of the present disclosure a display panel, comprising the gate driving circuit provided in the embodiments of the present disclosure. Since the principle for solving the problem by the display panel is similar to the gate driving circuit, the implementation of the display panel can refer to the implementation of the gate driving circuit described above, and thus no further description is given herein.

Based on a same inventive concept, there is provided in an embodiment of the present disclosure a display apparatus, comprising the display panel provided in the embodiments of the present disclosure. The display apparatus can be applicable to any product or means having the display function, such as a mobile phone, a tablet computer, a television, a display, a notebook computer, a digital photo frame, a navigator and so on. Since the principle for solving the problem by the display apparatus is similar to the display panel, the implementation of the display apparatus can refer to the implementation of the display panel, and thus no further description is given herein.

There are provided in the embodiments of the present disclosure a shift register, a gate driving circuit, a display panel and a display apparatus. The shift register comprises: an input module, a reset module, an output module and a buffer module. The input module is configured to output the signal of the signal input terminal to the first node under the control of the first reference signal terminal and the second reference signal terminal; the reset module is configured to output the signal of the reset signal terminal to the first node under the control of the first reference signal terminal and the second reference signal terminal; the output module is configured to output the signal of the first node to the scanning signal output terminal under the control of the second node; and the buffer module is configured to output the signal of the first node to the triggering signal terminal under the control of the clock signal terminal. The shift register of the present disclosure further comprises the auxiliary module configured to output the high level signal input by the clock signal terminal to the second node under the control of the signal input terminal and the reset signal terminal, wherein the second node controls the output module to output the scanning signal to the scanning signal output terminal. In this way, the procedure that the shift register outputs the scanning signal to the corresponding gate line within the corresponding period of time, to drive the display panel to realize progressive scanning, can be realized. Compared with the prior art where the clock signals are input constantly to the shift register when the shift register operates normally, the shift register of the present disclosure inputs selectively the clock signal input by the clock signal terminal to the shift register by adding the auxiliary module, that is, when the shift register outputs the scanning signal, the cock signal is input selectively, and the clock signal input by the clock signal terminal within other periods of time is maintained in a low potential state, such that the power consumption of the shift register can be reduced.

Obviously, those skilled in the art can make various modifications and alternations to technical solutions of the present disclosure, without departing from the spirit and scope of the present disclosure. As such, if these alternations and modifications of the present disclosure belong to the scope of the claims as well as their equivalent technology, then the present disclosure intends to include these alternations and modifications.

The present application claims the priority of a Chinese patent application No. 201510138219.2 filed on Mar. 26, 2015. Herein, the content disclosed by the Chinese patent application is incorporated in full by reference as a part of the present disclosure.

What is claimed is:

1. A shift register, comprising:
an input module, whose input terminal is connected to a signal input terminal, first control terminal is connected to a first reference signal terminal, second control terminal is connected to a second reference signal terminal, and output terminal is connected to a first node, and configured to output a signal of the signal input terminal to the first node under the control of the first reference signal terminal and the second reference signal terminal;
a reset module, whose input terminal is connected to a reset signal terminal, first control terminal is connected to the second reference signal terminal, second control terminal is connected to the first reference signal terminal, and output terminal is connected to the first node, and configured to output a signal of the reset signal terminal to the first node under the control of the first reference signal terminal and the second reference signal terminal;
an output module, whose input terminal is connected to the first node, control terminal is connected to a second node, and output terminal is connected to a scanning signal output terminal, and configured to output a signal of the first node to the scanning signal output terminal under the control of the second node;
a buffer module, whose input terminal is connected to the first node, control terminal is connected to a clock signal terminal, and output terminal is connected to a triggering signal terminal, and configured to output the signal of the first node to the triggering signal terminal for inputting a triggering signal to a signal input terminal of an adjacent next state of shift register under the control of the clock signal terminal; and
an auxiliary module, whose first input terminal is connected to the clock signal terminal, second input terminal is connected to a low level signal terminal, first control terminal is connected to the signal input terminal, second control terminal is connected to the reset signal terminal, and output terminal is connected to the second node, and configured to output a high level signal input by the clock signal terminal, under the control of the signal input terminal and the reset signal terminal, to the second node which controls the output module to output a scanning signal to the scanning signal output terminal,
wherein the auxiliary module comprises: a first transmission gate, a first NOT gate, a switch transistor, and a NOR gate; wherein
a first input terminal of the NOR gate is connected to the signal input terminal, a second input terminal thereof is connected to the reset signal terminal, and an output terminal thereof is connected to an input terminal of the first NOT gate, a gate of the switch transistor and a first control terminal of the first transmission gate respectively;
a second control terminal of the first transmission gate is connected to an output terminal of the first NOT gate, an input terminal thereof is connected to the clock signal terminal, and an output terminal is connected to a source of the switch transistor and the second node respectively; and
a drain of the switch transistor is connected to the low level signal terminal,
and the operation process of the shift register comprises a scanning signal delivering phase, a scanning signal outputting phase and a scanning signal output maintaining phase, wherein, only when the shift register operates in the scanning signal outputting phase, the potential of the second node P2 is pulled up to control the output module to output a signal of the first node to the scanning signal output terminal.

2. The shift register according to claim 1, wherein the output module comprises: a second NOT gate, a third NOT gate, a first tri-state gate and a second tri-state gate; wherein
an input terminal of the second NOT gate is connected to the second node, an output terminal thereof is connected to a first control terminal of the first tri-state gate and a second control terminal of the second tri-state gate respectively;
an input terminal of the first tri-state gate is connected to the first node, a second control terminal thereof is connected to the second node and a first control terminal of the second tri-state gate respectively, and an output terminal thereof is connected to an output terminal of the second tri-state gate and an input terminal of the third NOT gate respectively; and
an output terminal of the third NOT gate is connected to an input terminal of the second tri-state gate and the scanning signal output terminal respectively.

3. The shift register according to claim 1, wherein the input module comprises: a second transmission gate;
a first control terminal of the second transmission gate is connected to the first reference signal terminal, a second control terminal thereof is connected to the second reference signal terminal, an input terminal thereof is connected to the signal input terminal, and an output terminal thereof is connected to the first node.

4. The shift register according to claim 1, wherein the reset module comprises: a third transmission gate, whose first control terminal is connected to the second reference signal terminal, second control terminal thereof is connected to the first reference signal terminal, input terminal thereof is connected to the reset signal terminal, and output terminal thereof is connected to the first node.

5. The shift register according to claim 1, wherein the buffer module comprises: a NAND gate, a fourth NOT gate, a fifth NOT gate a sixth NOT gate; wherein
a first input terminal of the NAND gate is connected to the clock signal terminal, a second input terminal thereof is connected to the first node, and an output terminal thereof is connected to an input terminal of the fourth NOT gate;
an output terminal of the fourth NOT gate is connected to an input terminal of the fifth NOT gate;
an output terminal of the fifth NOT gate is connected to an input terminal of the sixth NOT gate; and
an output terminal of the sixth NOT gate is connected to the triggering signal terminal.

6. A gate driving circuit, comprising a plurality of shift registers as claimed in claim 1 and connected in cascades, except for a first stage of shift register and a last stage of shift register, a triggering signal terminal of each of remaining stages of shift registers is connected to a signal input terminal of an adjacent next stage of shift register, and a scanning signal output terminal thereof is connected to a reset signal terminal of an adjacent previous stage of shift register; a triggering signal terminal of the first stage of shift register is connected to a signal input terminal of a second stage of shift register; and a scanning signal output terminal of the last stage of shift register is connected to a reset signal terminal of itself and the reset signal terminal of the adjacent previous stage of shift register respectively.

7. A display panel, comprising the gate driving circuit according to claim 6.

8. A display apparatus, comprising the display panel according to claim 7.

9. The shift register according to claim 2, wherein the input module comprises: a second transmission gate;
a first control terminal of the second transmission gate is connected to the first reference signal terminal, a second control terminal thereof is connected to the second reference signal terminal, an input terminal thereof is connected to the signal input terminal, and an output terminal thereof is connected to the first node.

10. The shift register according to claim 2, wherein the reset module comprises: a third transmission gate, whose first control terminal is connected to the second reference signal terminal, second control terminal thereof is connected to the first reference signal terminal, input terminal thereof is connected to the reset signal terminal, and output terminal thereof is connected to the first node.

11. The shift register according to claim 2, wherein the buffer module comprises: a NAND gate, a fourth NOT gate, a fifth NOT gate a sixth NOT gate; wherein
a first input terminal of the NAND gate is connected to the clock signal terminal, a second input terminal thereof is connected to the first node, and an output terminal thereof is connected to an input terminal of the fourth NOT gate;
an output terminal of the fourth NOT gate is connected to an input terminal of the fifth NOT gate;
an output terminal of the fifth NOT gate is connected to an input terminal of the sixth NOT gate; and
an output terminal of the sixth NOT gate is connected to the triggering signal terminal.

12. The gate driving circuit according to claim 6, wherein the output module comprises: a second NOT gate, a third NOT gate, a first tri-state gate and a second tri-state gate; wherein
an input terminal of the second NOT gate is connected to the second node, an output terminal thereof is connected to a first control terminal of the first tri-state gate and a second control terminal of the second tri-state gate respectively;
an input terminal of the first tri-state gate is connected to the first node, a second control terminal thereof is connected to the second node and a first control terminal of the second tri-state gate respectively, and an output terminal thereof is connected to an output terminal of the second tri-state gate and an input terminal of the third NOT gate respectively; and
an output terminal of the third NOT gate is connected to an input terminal of the second tri-state gate and the scanning signal output terminal respectively.

13. The gate driving circuit according to claim 6, wherein the input module comprises: a second transmission gate;
a first control terminal of the second transmission gate is connected to the first reference signal terminal, a second control terminal thereof is connected to the second reference signal terminal, an input terminal thereof is connected to the signal input terminal, and an output terminal thereof is connected to the first node.

14. The gate driving circuit according to claim 6, wherein the reset module comprises: a third transmission gate, whose first control terminal is connected to the second reference signal terminal, second control terminal thereof is connected to the first reference signal terminal, input terminal thereof is connected to the reset signal terminal, and output terminal thereof is connected to the first node.

15. The gate driving circuit according to claim 6, wherein the buffer module comprises: a NAND gate, a fourth NOT gate, a fifth NOT gate a sixth NOT gate; wherein
a first input terminal of the NAND gate is connected to the clock signal terminal, a second input terminal thereof is connected to the first node, and an output terminal thereof is connected to an input terminal of the fourth NOT gate;
an output terminal of the fourth NOT gate is connected to an input terminal of the fifth NOT gate;
an output terminal of the fifth NOT gate is connected to an input terminal of the sixth NOT gate; and
an output terminal of the sixth NOT gate is connected to the triggering signal terminal.

* * * * *